(12) United States Patent
Lin et al.

(10) Patent No.: US 6,472,301 B1
(45) Date of Patent: Oct. 29, 2002

(54) METHOD AND STRUCTURE FOR SHALLOW TRENCH ISOLATION

(75) Inventors: Chuan Lin, Poughquag; Thomas Schafbauer; Paul Wensley, both of Wappingers Falls, all of NY (US)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 09/421,161

(22) Filed: Oct. 19, 1999

(51) Int. Cl.[7] ............... H01L 21/8242; H01L 21/76; H01L 21/425
(52) U.S. Cl. ............... 438/524; 438/433; 438/527; 438/224
(58) Field of Search ............... 438/524, 433, 438/527, 224

(56) References Cited

U.S. PATENT DOCUMENTS

| | | | | |
|---|---|---|---|---|
| 5,372,950 A | * | 12/1994 | Kim et al. | |
| 5,686,344 A | * | 11/1997 | Lee | |
| 5,811,347 A | * | 9/1998 | Gardner et al. | |
| 5,825,066 A | * | 10/1998 | Buynoski | |
| 5,891,787 A | * | 4/1999 | Gardner et al. | |
| 5,937,287 A | * | 8/1999 | Gonzalez | |
| 6,144,086 A | * | 11/2000 | Brown et al. | |
| 6,207,532 B1 | | 3/2001 | Lin et al. | |

* cited by examiner

*Primary Examiner*—Richard Booth
*Assistant Examiner*—Ron Pompey
(74) *Attorney, Agent, or Firm*—Slater & Matsil, LLP

(57) ABSTRACT

A method (see e.g., FIG. 4) of fabricating a semiconductor device includes forming a trench 12 in a semiconductor body 10. A dielectric layer 26 is formed within the trench 12. Dielectric layer 26 lines the sidewall and, possibly, the bottom portions of the trench 12 in a manner where the thickness of the dielectric 26s at the sidewall is greater than the thickness of the dielectric 26b at the bottom. A dopant 28 can then be implanted into the semiconductor body beneath the trench.

33 Claims, 2 Drawing Sheets

METHOD AND STRUCTURE FOR SHALLOW TRENCH ISOLATION

FIELD OF THE INVENTION

The present invention relates generally semiconductor devices and more particularly a method and structure for shallow trench isolation.

BACKGROUND OF THE INVENTION

Isolation between devices within a semiconductor chip becomes more critical as device size gets smaller. Field oxide isolation is one common solution. With field oxide isolation, regions of oxide material are thermally grown to define active areas on the semiconductor chip. This technique requires considerable surface area and therefore is not desirable for highly integrated devices.

Another known solution is deep trench isolation, a technique where relatively deep trenches are filled with dielectric material and positioned between active devices. Unfortunately, forming reliable deep trenches is very complicated and challenging, especially as spacing between devices get smaller. In addition, acceptable isolation is often not possible unless the depth of the trench is larger than the well depth.

Hence, shallow trench isolation (STI) is often used. One problem with STI is caused by poor well alignment, a situation where the boundary of the well is at the edge or at the outside of the trench.

Poor well alignment is not typically due to poor lithography and process control. Rather, it is often due to different well dopant concentration and diffusion. Well dopant diffusion is a difficult to adjust to achieve good well alignment since dopant diffusion is determined by the dopant species, dose, and profile and these parameters are governed by device performance optimization. As a result, it is very difficult to adjust the well implant conditions to achieve the good well alignment without compromising the device's performance.

The present invention provides an isolation process which solves some of the problems found with the prior art.

SUMMARY OF THE INVENTION

In various aspects of the present invention, additional implants through a shallow trench are used to achieve good isolation without impacting device performance. The new process is very simple and highly compatible with current CMOS processes.

In this disclose, an implant, preferably low dose, through STI is used to achieve good well alignment. This implant gives device designers a new knob to optimize device performance and isolation simultaneously.

In one embodiment of the present invention, a trench is formed in a semiconductor body. A dielectric layer is formed within the trench. Dielectric layer lines the sidewall and bottom portions of the trench in a manner where the thickness of the dielectric at the sidewall is greater than the thickness of the dielectric at the bottom. A dopant can be implanted into the semiconductor body beneath the trench.

In one aspect, the present invention solves device isolation problem by using a simple implant. This invention provides a knob to allow device designer to optimize device performance and isolation simultaneously. The usage of a nitrogen implant and an implant spacer (dielectric layer) before the implant effectively reduces the unwanted diffusion and distribution of the implanted dopant. Therefore, this technique has no significant impact on device performance.

BRIEF DESCRIPTION OF THE DRAWINGS

The above features of the present invention will be more clearly understood from consideration of the following descriptions in connection with accompanying drawings in which.

DETAILED DESCRIPTION

The making and use of the presently preferred embodiments are discussed below in detail. However, it should be appreciated that the present invention provides many applicable inventive concepts that can be embodied in a wide variety of specific contexts. The specific embodiments discussed are merely illustrative of specific ways to make and use the invention, and do not limit the scope of the invention.

The present invention will be described with respect to the preferred embodiment. Variations and modifications will be clear from the written description.

Figure 1:
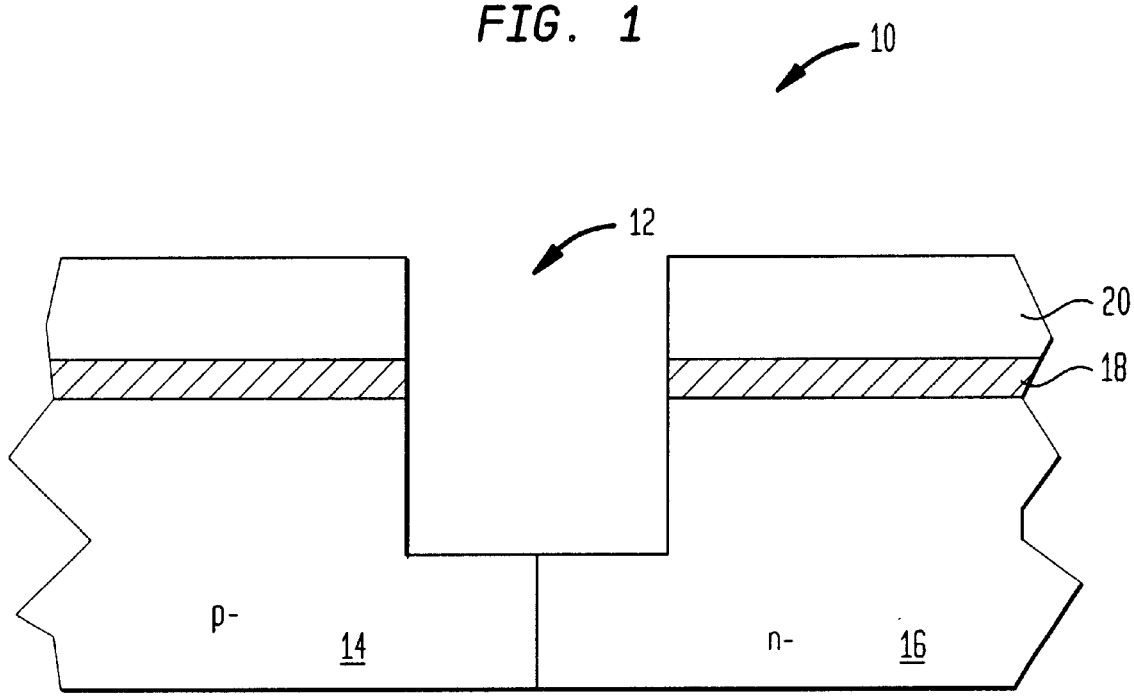
FIGS. 1–5 are cross-sectional diagrams showing a device formed at various stages of a preferred process of the present invention.

FIG. 1 shows a shallow trench 12 being formed in a silicon device 10. Trench 12 is located at the boundary between p-well 14 and n-well 16. As is known in the art, nchannel MOS (metal oxide semiconductor) device(s) can be formed in p-well 14 and p-channel MOS device(s) can be formed in n-well 16. The wells can be formed in a semiconductor substrate or in a layer of semiconductor material, e.g., an epitaxially grown layer over a substrate or a dielectric (e.g., SOI).

Trench 12 can be formed using known processes. In the preferred embodiment, a first dielectric layer 18 is formed over the surface of a silicon substrate. Dielectric layer 18 is preferably an oxide such as $SiO_2$ and is between about 4 nm and about 15 nm thick. This layer 18 can be formed by thermal oxidation or other processes.

Second dielectric layer 20 is formed over the dielectric layer 18. This layer 20 is preferably a nitride such as $Si_3N_4$ and is typically between about 80 nm and 200 nm thick. This layer 20 can be formed by low pressure chemical vapor deposition or other processes.

Trench 12 is preferably formed using known photolithographic and etching techniques. In the preferred embodiment, the trench is about 120 to 700 nm wide and about 300 nm deep. In typical contexts, a shallow trench is between about 250 nm and 500 nm deep.

Figure 2:
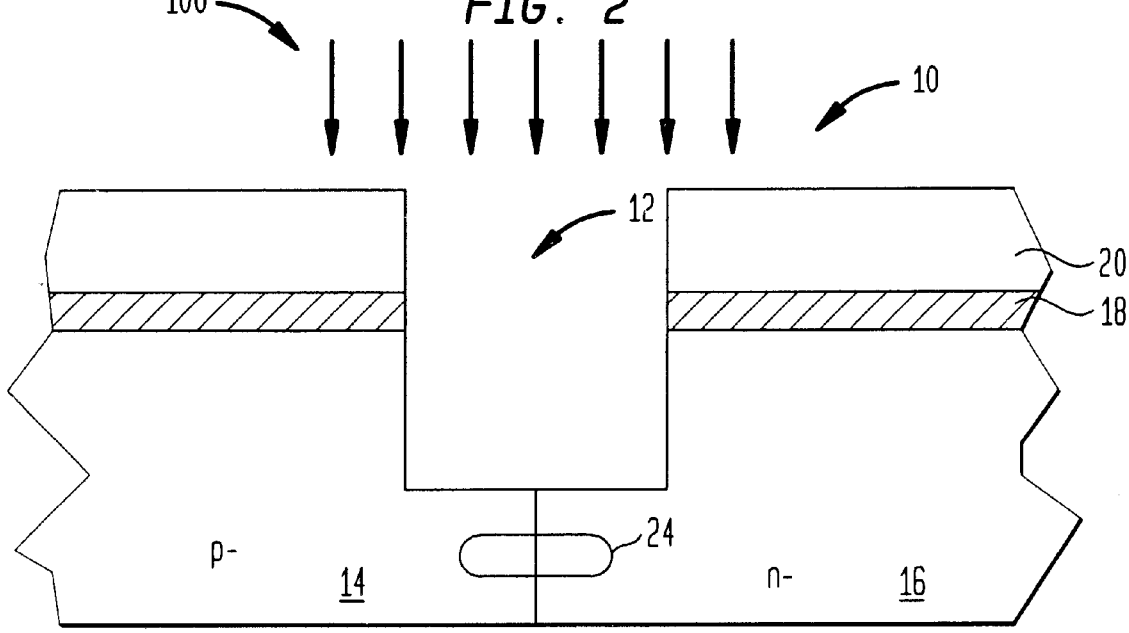

After standard STI silicon etching, an optional nitrogen implant can be performed, as illustrated in FIG. 2. The nitrogen implant can be accomplished by implanting a nitrogen bearing species, denoted by reference numeral 22, such as $N^+$ or $N_2^+$. The implantation is preferably performed at an energy between about 10 keV and about 50 keV and a dose between about $1 \times 10^{13}$ cm$^{-2}$ and about $5 \times 10^{14}$ cm$^{-2}$.

One purpose of the nitrogen implant is to limit dopant (compensation implant) diffusion and the oxide thickness under the trench 12. This step is optional and can be eliminated if desired.

Figure 3:
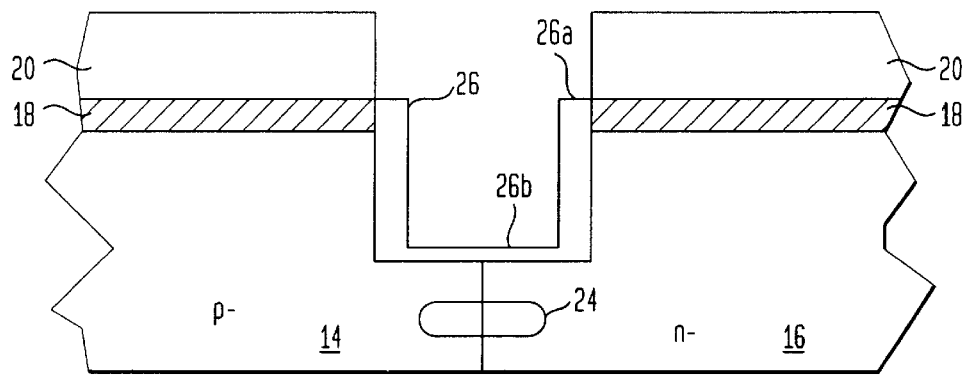

Referring next to FIG. 3, a dielectric layer 26 is formed. As illustrated in the figure, dielectric layer 26 is thicker at the sidewall portion 26s than at the bottom portion 26b. In the preferred embodiment, dielectric 26 is an oxide such as $SiO_2$. Other materials could alternatively be used.

As a practical matter, the sidewalls of trench 12 are not always formed at a 90° angle with respect to the upper surface of the device. As a result, a blanket implantation of dopants (see FIG. 4 and related text) into the trench would leave dopants in the sidewalls as well as the bottom of the trench. These dopants can cause leakage currents that are undesirable.

Dielectric layer 26 will serve to block the subsequent implant (FIG. 4) along the sidewall of trench 12 (and also minimize the spread of dopant under trench 12), while allowing implantation into the bottom of the trench 12. The offset in sidewall to bottom thickness can be achieved by thermal oxidation (where the difference can result from the slower oxidation rate at the bottom of the STI due to the nitrogen implant and/or the different crystal plane).

Alternatively an optional TEOS (tetraethyloxysilane) deposition and RIE (reactive ion etch) step can be used to achieve a specific spacer-shape. This alternative method would require additional processing, but the implant/spacer width would provide very powerful parameters to optimize well isolation.

In the preferred embodiment, the sidewall portion 26s of dielectric layer 26 is between about 15 nm and about 30 nm thick. The bottom portion 26b is between about 0 nm and about 15 nm thick. In the extreme case, the present invention contemplates that no dielectric is formed at the bottom of the trench. In a typical embodiment, the sidewall portion 26s is preferably between about 1.2 and about 2 times thicker than the bottom portion 26b.

Figure 4:
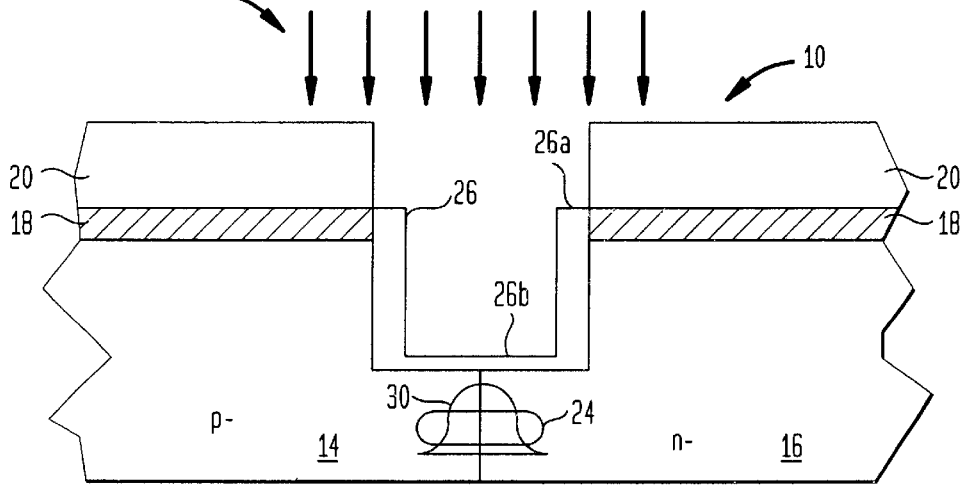

Referring now to FIG. 4, a dopant is implanted into trench 12. In the preferred embodiment, a low dose indium, gallium, antimony, and/or arsenic, indicated by reference numeral 28, is implanted into the shallow trench 12. In the preferred embodiment, the implant is performed at an energy between about 7 keV and about 50 keV for arsenic and gallium and between about 20 keV and 100 keV for indium. These implants preferably have a dose between about $1\times10^{11}$ cm$^{-2}$ and $5\times10^{12}$ cm$^{-2}$. This processing creates a doped region 30 that has a peak concentration about $10^{18}$ cm$^{-3}$ beneath the bottom of trench 12.

This low dose implant 28 can be used to achieve good well alignment by balancing different well dopant diffusion. The choice of which species to use depends on the process conditions. For example, in some situations the concentration of p-type dopants in p-well 14 may be less than the concentration of n-type dopants in n-well 16. In this case, which is sometimes referred to as weak p-well, it is likely that n-type dopants will diffuse into the p-well. By implanting a p-type dopant beneath the trench, the concentration in the p-well will go up while the overall concentration in the n-well will go down. This condition will help minimize diffusion between the wells.

Similarly, in the case of a weak n-well, the concentration of n-type dopants in n-well 16 will be less than the concentration of p-type dopants in p-well 14. In this situation, it would desirable to dope the region beneath trench 12 with n-type dopants so that diffusion will be minimized.

While any n-type or p-type dopants can be used, the preferred embodiment utilizes dopants that will not diffuse laterally. So with a weak p-well, an indium (or gallium) implant is preferably used. On the other hand, if there is weak n-well, then antimony (or arsenic) is preferably used. It is noted, however, that other dopants such as boron (p-type) or phosphorus (n-type) could also be used. Further, any combination of these dopants could be used. The implant dose is determined by process conditions.

Figure 5:
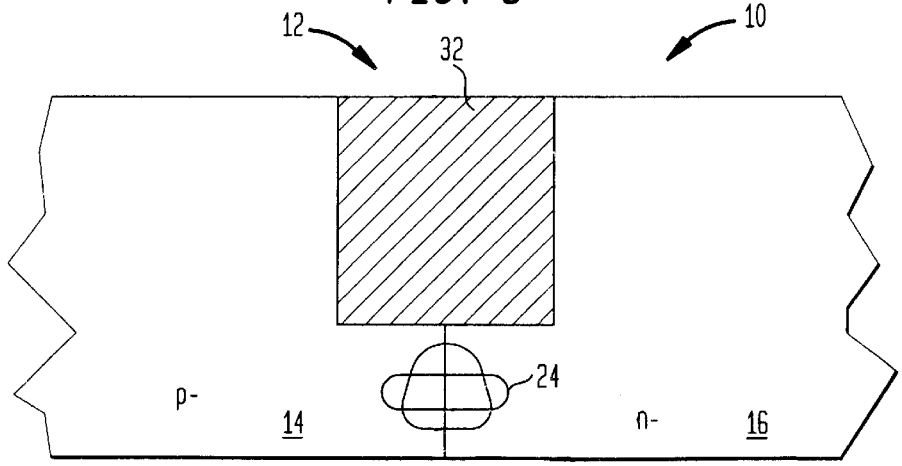

The isolation structure 10 can be completed using standard STI formation processes. As shown in FIG. 5, the trench 12 is filled with a dielectric material 32.

There are several advantages that can be achieved by various embodiments of this new process and resulting structure. First, the process provides additional dopant under trench 12 to achieve good well alignment without adjusting the well implant conditions. Not only is it difficult to achieve good well alignment by adjusting well implant, but it is also impractical since the well implant conditions are determined by device performance. This new low dose implant provides a knob to adjust the well alignment very easily. Optimal well alignment is extremely useful for good isolation.

In addition, due to the sidewall dielectric 26s and nitrogen implant 24, dopant is only implanted into the bottom and center of the trench 12. Therefore, the additional implant will not impact upon device performance. Since the preferred dopants are "heavy" dopants, the diffusion of these materials will be minimal. Also, the nitrogen 24 limits the dopant diffusion under the trench 12.

The implant 28 is used after the dielectric 26 is formed. The dielectric 26 limits the spread of dopant underneath the trench 12 and reduces the dopant into the sidewall of trench 12. This limits the impact of this implant on device performance.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. A method of fabricating a semiconductor device, the method comprising:

forming a trench in a semiconductor body;

forming a dielectric layer within the trench, the dielectric layer lining at least a sidewall portion of the trench, wherein the thickness of the dielectric layer at the sidewall is greater than a thickness of dielectric at the bottom;

after forming the dielectric layer, implanting a dopant into the trench, the dopant being implanted into the semiconductor body beneath the trench; and after implanting the dopant into the trench, filling the trench.

2. The method of claim 1 and further comprising implanting a nitrogen bearing species into the portion of the semiconductor body beneath the trench.

3. The method of claim 2 wherein the nitrogen bearing species is implanted prior to forming a dielectric layer within the trench.

4. The method of claim 2 wherein the nitrogen bearing species comprises N$^+$ or N$_2^+$.

5. The method of claim 1 wherein the thickness of the dielectric layer at the sidewall is at least about 1.2 times greater than the thickness of the dielectric at the bottom.

6. The method of claim 1 wherein the dielectric layer comprises an oxide layer.

7. The method of claim 1 and further comprising the step of forming a nitride layer over the semiconductor body prior to forming a trench in the semiconductor body.

8. The method of claim 1 wherein forming a dielectric layer comprises thermally growing an oxide layer.

9. The method of claim 1 wherein forming a dielectric layer comprises growing a conformal layer of dielectric material and anisotropically etching the conformal layer of dielectric material.

10. The method of claim 1 wherein implanting a dopant comprises implanting a dopant selected from the group consisting of antimony, gallium, indium and arsenic and combinations thereof.

11. The method of claim 1 wherein forming a trench comprises forming a shallow trench.

12. The method of claim 1 wherein filling the trench comprises filling the trench with an electrically insulating material.

13. A method of fabricating a semiconductor device, the method comprising:
forming a trench in a semiconductor body;
forming a dielectric layer within the trench, the dielectric layer lining at least a sidewall portion of the trench, wherein the thickness of the dielectric layer at the sidewall is greater than a thickness of dielectric at the bottom wherein the dielectric layer lines the sidewall and bottom portions of the trench;
implanting a dopant into the trench, the dopant being implanted into the semiconductor body beneath the trench, wherein the dopant is implanted through the dielectric layer at the bottom portion of the trench; and
filling the trench.

14. The method of claim 1 wherein the dielectric layer lines the sidewall portion of the trench but not the bottom portion of the trench.

15. A method of forming a semiconductor device, the method comprising:
forming an oxide layer on the surface of a semiconductor body;
forming a nitride layer over the oxide layer;
etching portions of the oxide layer, the nitride layer, and the semiconductor body to form a trench in the semiconductor body;
implanting a nitrogen bearing species through the trench and into a portion of the semiconductor body beneath the trench;
forming a dielectric layer within the trench, the dielectric layer lining sidewall and bottom portions of the trench, wherein the thickness of the dielectric layer at the sidewall is greater than the thickness of the dielectric at the bottom;
implanting a dopant into the trench, the dopant being implanted through the dielectric layer at the bottom portion of the trench and into the semiconductor body beneath the trench; and
filling the trench with an insulating material.

16. The method of claim 15 and further comprising forming an n-well and a p-well within the semiconductor body, the trench being formed at a boundary between the n-well and the p-well.

17. The method of claim 16 wherein implanting a dopant into the trench comprises implanting a p-type dopant when the doping concentration of the n-well is greater than the doping concentration of the p-well.

18. The method of claim 17 wherein the p-type dopant comprises indium or gallium.

19. The method of claim 16 wherein implanting a dopant into the trench comprises implanting an n-type dopant when the doping concentration of the n-well is less than the doping concentration of the p-well.

20. The method of claim 19 wherein the n-type dopant comprises arsenic or antimony.

21. The method of claim 15 wherein the nitrogen bearing species comprises $N_2$ or $N_2^+$.

22. The method of claim 15 wherein the thickness of the dielectric layer at the sidewall is between about 1.2 and about 2 times greater than the thickness of the dielectric at the bottom.

23. The method of claim 15 wherein the dielectric layer comprises an oxide layer.

24. The method of claim 15 wherein forming a dielectric layer comprises thermally growing an oxide layer.

25. The method of claim 15 wherein forming a dielectric layer comprises growing a conformal layer of electric material and anisotropically etching the conformal layer of dielectric material.

26. The method of claim 15, wherein implanting a dopant comprises implanting a dopant selected from the group consisting of antimony, indium and arsenic.

27. The method of claim 15 wherein forming a trench comprises forming a shallow trench.

28. A method of fabricating a semiconductor device, the method comprising:
forming a trench in a semiconductor body;
forming a dielectric layer within the trench, the dielectric layer lining at least a sidewall portion of the trench, wherein the thickness of the dielectric layer at the sidewall is greater than a thickness of dielectric at the bottom;
after forming the dielectric layer, implanting a dopant into the entire trench, the dopant being implanted into the semiconductor body beneath the trench; and
filling the trench.

29. The method of claim 28 and further comprising implanting a nitrogen bearing species into the portion of the semiconductor body beneath the trench.

30. The method of claim 29 wherein the nitrogen bearing species is implanted prior to forming a dielectric layer within the trench.

31. The method of claim 28 wherein the thickness of the dielectric layer at the sidewall is at least about 1.2 times greater than the thickness of the dielectric at the bottom.

32. The method of claim 28 wherein the dielectric layer lines the sidewall and bottom portions of the trench and wherein the dopant is implanted through the dielectric layer at the bottom portion of the trench.

33. The method of claim 28 wherein the dielectric layer lines the sidewall portion of the trench but not the bottom portion of the trench.

* * * * *